United States Patent
Tadokoro et al.

(10) Patent No.: US 7,957,828 B2
(45) Date of Patent: Jun. 7, 2011

(54) TEMPERATURE SETTING METHOD FOR THERMAL PROCESSING PLATE, TEMPERATURE SETTING APPARATUS FOR THERMAL PROCESSING PLATE, AND COMPUTER-READABLE STORAGE MEDIUM

(75) Inventors: Masahide Tadokoro, Koshi (JP); Megumi Jyousaka, Koshi (JP); Yoshitaka Konishi, Koshi (JP); Shinichi Shinozuka, Koshi (JP); Kunie Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 496 days.

(21) Appl. No.: 12/099,970

(22) Filed: Apr. 9, 2008

(65) Prior Publication Data
US 2008/0257495 A1    Oct. 23, 2008

(30) Foreign Application Priority Data
Apr. 20, 2007   (JP) ................... 2007-111812

(51) Int. Cl.
*G06F 19/00* (2006.01)
(52) U.S. Cl. ........................ 700/121; 702/136
(58) Field of Classification Search .................. 700/121; 702/136
See application file for complete search history.

(56) References Cited

U.S. PATENT DOCUMENTS

| | | | | |
|---|---|---|---|---|
| 5,626,782 | A * | 5/1997 | Maeda | 219/444.1 |
| 6,402,509 | B1 * | 6/2002 | Ookura et al. | 432/253 |
| 6,984,477 | B2 | 1/2006 | Ogata et al. | |
| 7,094,994 | B2 * | 8/2006 | Oyama et al. | 219/444.1 |
| 7,488,127 | B2 | 2/2009 | Ogata et al. | |
| 7,715,952 | B2 * | 5/2010 | Jyousaka et al. | 700/300 |
| 7,780,366 | B2 | 8/2010 | Ogata et al. | |
| 2006/0262287 | A1 * | 11/2006 | Hiar et al. | 355/30 |
| 2008/0105669 | A1 * | 5/2008 | Jyousaka et al. | 219/448.12 |
| 2008/0116195 | A1 * | 5/2008 | Jyousaka et al. | 219/494 |
| 2008/0142508 | A1 * | 6/2008 | Jyousaka et al. | 219/483 |
| 2008/0254394 | A1 * | 10/2008 | Kobayashi et al. | 430/322 |
| 2008/0257495 | A1 * | 10/2008 | Tadokoro et al. | 156/345.27 |
| 2008/0257496 | A1 * | 10/2008 | Jyousaka et al. | 156/345.27 |
| 2009/0078695 | A1 * | 3/2009 | Jyousaka et al. | 219/494 |
| 2009/0082911 | A1 * | 3/2009 | Jyousaka et al. | 700/300 |
| 2010/0047702 | A1 | 2/2010 | Ogata et al. | |

FOREIGN PATENT DOCUMENTS

| | | |
|---|---|---|
| JP | 2001-143850 | 5/2001 |
| JP | 2006-222354 | 8/2006 |
| JP | 2006-228816 | 8/2006 |
| WO | 2006/085527 A1 | 8/2006 |
| WO | 2007/032369 A1 | 3/2007 |
| WO | 2007/032370 A1 | 3/2007 |
| WO | 2007/032372 A1 | 3/2007 |

* cited by examiner

*Primary Examiner* — Michael D Masinick
(74) *Attorney, Agent, or Firm* — Oblon, Spivak, McClelland, Maier & Neustadt, L.L.P.

(57) ABSTRACT

In the present invention, the line widths within a substrate of an etching pattern are measured for a substrate for which photolithography processing and an etching treatment thereafter have been finished. The line width measurement results are converted into the line widths of a resist pattern using relational expressions which have been obtained in advance. From the converted line widths of the resist pattern, coefficients of a polynomial function indicating variations within the substrate are calculated. Next, a function between line width correction amounts for the resist pattern and temperature correction values is used to calculate temperature correction values for the regions of the thermal plate to bring the coefficients of the polynomial function close to zero. Based on each of the calculated temperature correction values, the temperature for each of the regions is set.

23 Claims, 9 Drawing Sheets

$$J = \begin{Bmatrix} J_{11}, J_{12}, & \cdots & J_{1m} \\ J_{21}, J_{22}, & \cdots & J_{2m} \\ \vdots & \ddots & \vdots \\ J_{n1}, J_{n2}, & \cdots & J_{nm} \end{Bmatrix}$$

FIG.13

TEMPERATURE SETTING METHOD FOR THERMAL PROCESSING PLATE, TEMPERATURE SETTING APPARATUS FOR THERMAL PROCESSING PLATE, AND COMPUTER-READABLE STORAGE MEDIUM

BACKGROUND OF THE INVENTION

1. Field of the Invention

The present invention relates to a temperature setting method for a thermal processing plate, a temperature setting apparatus for a thermal processing plate, and a computer-readable storage medium.

2. Description of the Related Art

In a photolithography process in manufacturing, for example, a semiconductor device, for example, resist coating treatment of applying a resist solution onto a processing film on a wafer to form a resist film, exposure processing of exposing the resist film into a predetermined pattern, heat-processing of accelerating the chemical reaction in the resist film after exposure (post-exposure baking), and developing treatment of developing the exposed resist film are performed in sequence, so that a predetermined resist pattern is formed on the wafer by the series of photolithography processing. The wafer is then subjected to etching treatment in which a predetermined etching pattern is formed in the processing film.

For example, the heat-processing such as the aforementioned post-exposure baking is usually performed in a heat-processing unit. The heat-processing unit includes a thermal plate mounting and heating the wafer thereon. The thermal plate incorporates a heater generating heat, for example, by power feeding, and the thermal plate is adjusted to a predetermined temperature by the heat generation by the heater.

The thermal processing temperature in the above-described heat-processing greatly affects, for example, the line width of the resist pattern formed on the wafer. Hence, to strictly control the temperatures within the wafer during heating, the thermal plate of the above-described heat-processing unit is divided into a plurality of regions, and an independent heater is embedded in each of the regions to adjust the temperature for each of the regions.

It is known that if the temperature adjustment is performed at the same set temperature for all of the regions of the thermal plate, the temperatures within the wafer on the thermal plate vary due to the difference in heat resistance of the regions, resulting in variations in line width of the resist pattern. Therefore, the set temperatures of the regions of the thermal plate are temperature-corrected (temperature offset), and the temperature correction values for the regions are set to make uniform the temperatures within the wafer mounted on the thermal plate (Japanese Patent Application Laid-open No. 2001-143850).

However, even if the temperature correction values are set to uniform the temperatures within the wafer as in the prior art, actually, sufficiently uniform line widths of the resist pattern have not been formed. Hence, it is proposed that the temperature correction of the thermal plate is performed to bring the average value of the actually formed line widths of the resist pattern to a predetermined target line width value (Japanese Patent Application Laid-open No. 2006-222354).

SUMMARY OF THE INVENTION

However, even if the average value of the line widths of the resist pattern within the wafer is brought to the predetermined target line width as described above, the final line widths of a processing film after etching treatment may vary within the wafer. The variations in final line width of the processing film result in failure to form a desired circuit pattern.

The present invention has been developed in consideration of the above points, and its object is to make states such as line widths of an etching pattern after etching treatment uniform within a substrate.

The present invention to achieve the above object is a temperature setting method for a thermal processing plate mounting and thermally processing a substrate thereon, the thermal processing plate being divided into a plurality of regions, and a temperature being capable of being set for each of the regions, and a temperature correction value for adjusting an in-plane temperature of the thermal processing plate being capable of being set for each of the regions of the thermal processing plate.

The method of the present invention includes the steps of: measuring states of an etching pattern within the substrate measured for a substrate for which a series of photolithography processing including the thermal processing on the thermal processing plate and an etching treatment thereafter have been finished; calculating states of a resist pattern within the substrate from measurement result of the states of the etching pattern within the substrate using first functions between the states of the etching pattern within the substrate and the states of the resist pattern after the photolithography processing; calculating the temperature correction values for the regions of the thermal processing plate from calculation result of the states of the resist pattern within the substrate using a second function between correction amounts for the states of the resist pattern and the temperature correction values for the thermal processing plate; and setting the temperature for each of the regions of the thermal processing plate by each of the calculated temperature correction values.

According to the present invention, the temperature correction values for the regions of the thermal processing plate can be calculated and set using the first functions and the second function from the measurement result of the states of the etching pattern to improve the uniformity within the substrate of the finally formed etching pattern.

The present invention according to another aspect is a temperature setting apparatus for a thermal processing plate mounting and thermally processing a substrate thereon, the thermal processing plate being divided into a plurality of regions, and a temperature being capable of being set for each of the regions, and a temperature correction value for adjusting an in-plane temperature of the thermal processing plate being capable of being set by the temperature setting apparatus for each of the regions of the thermal processing plate. The temperature setting apparatus includes: a data storage unit storing, from states of an etching pattern within the substrate measured for a substrate for which a series of photolithography processing including the thermal processing on the thermal processing plate and an etching treatment thereafter have been finished, first functions between the states of the etching pattern within the substrate and states of a resist pattern after the photolithography processing and a second function between correction amounts for the states of the resist pattern and the temperature correction values for the thermal processing plate; and a program storage unit storing a program to calculate the states of the resist pattern within the substrate from measurement result of the states of the etching pattern within the substrate using the first functions, and calculate the temperature correction values for the regions of the thermal processing plate from calculation result of the states of the resist pattern within the substrate using the second function.

Then, the temperature for each of the regions of the thermal processing plate is set by each of the calculated temperature correction values.

The present invention according to another aspect is a computer-readable storage medium storing a program running on a computer of a control unit controlling a temperature setting apparatus to cause the temperature setting apparatus to execute the temperature setting method for a thermal processing plate.

According to the present invention, the uniformity of an etching pattern within the substrate is increased to improve the yields.

DETAILED DESCRIPTION OF THE INVENTION

Figure 1:
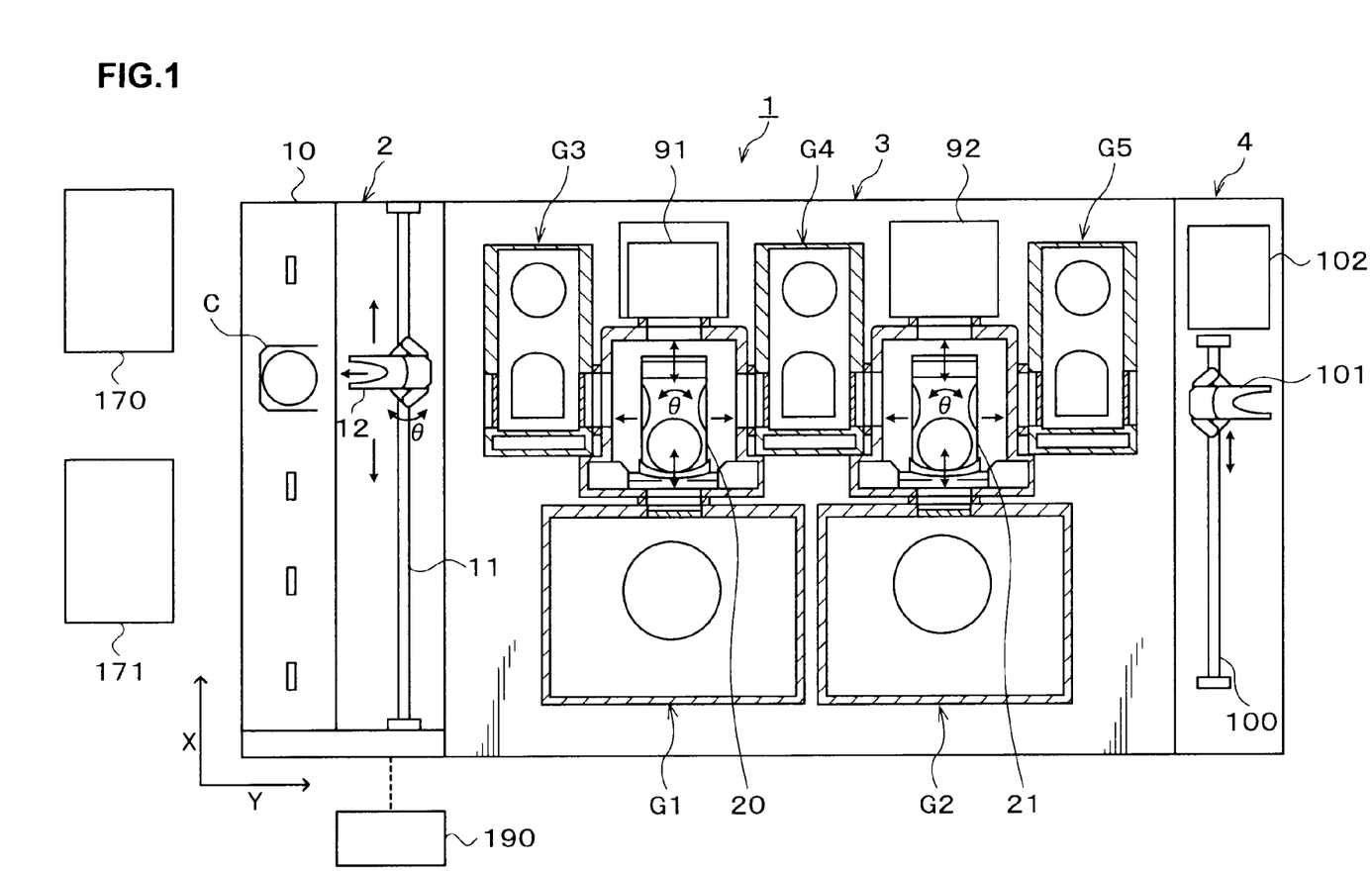
FIG. 1 is a plan view showing the outline of a configuration of a coating and developing treatment system.
Figure 2:
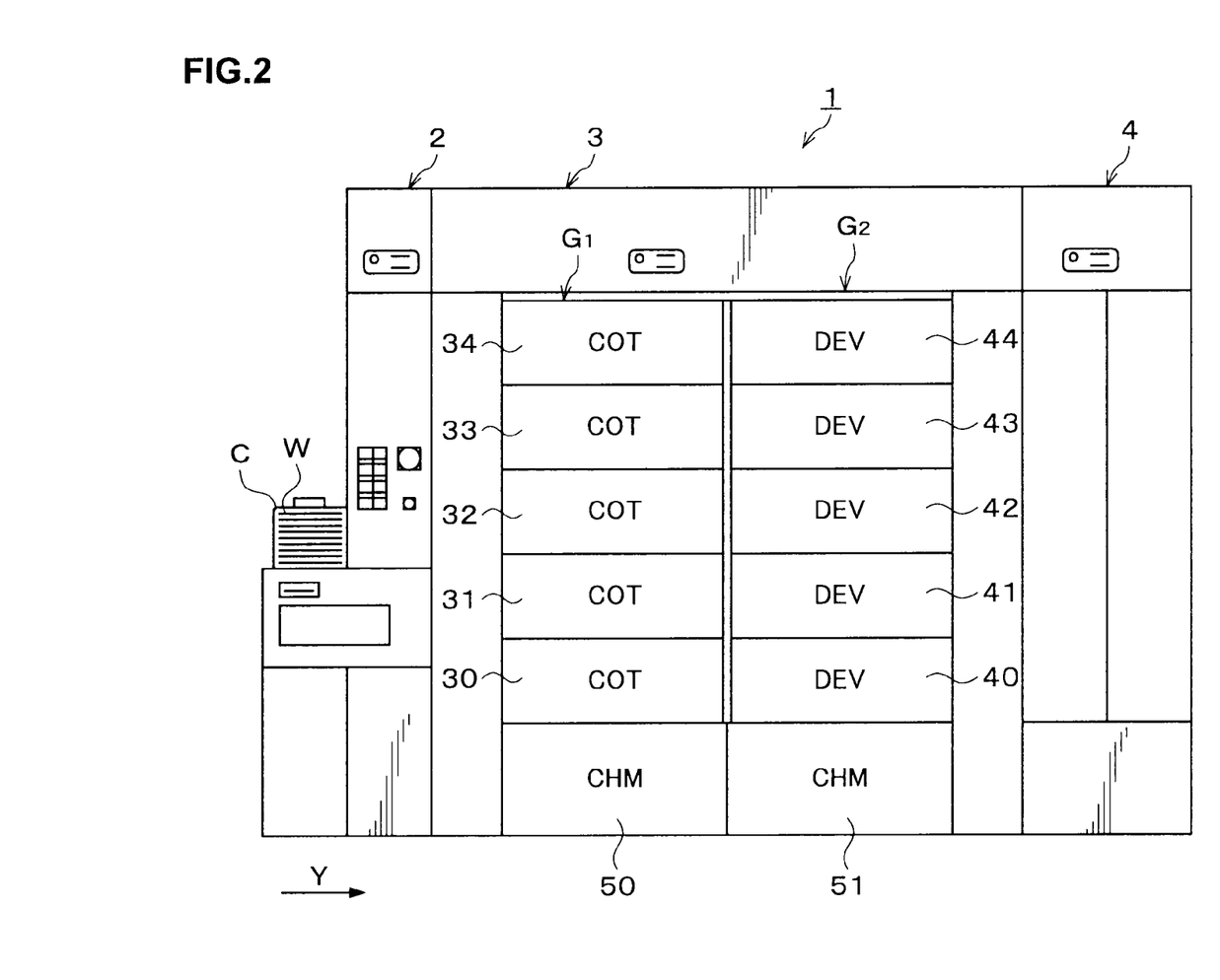
FIG. 2 is a front view of the coating and developing treatment system in FIG. 1.
Figure 3:
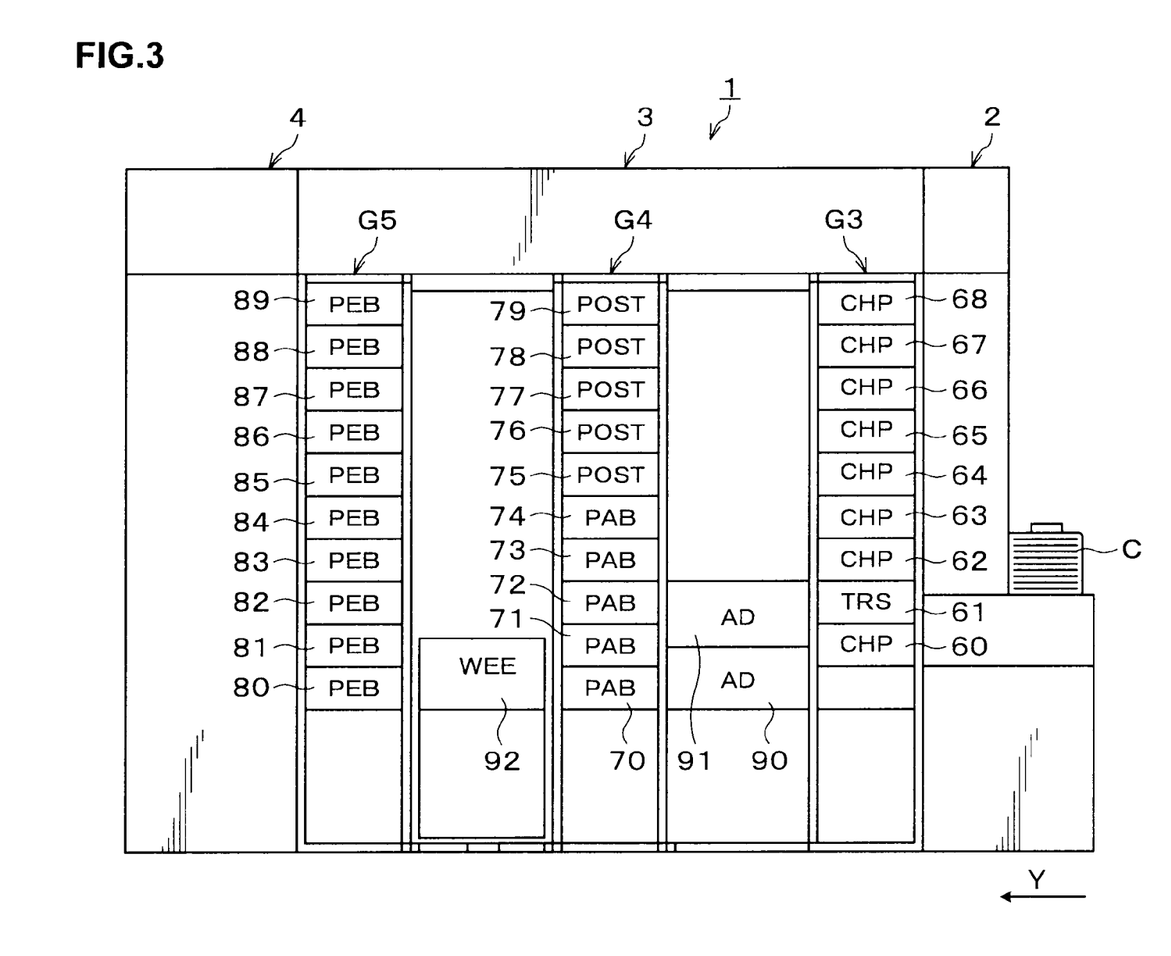
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 including a temperature setting apparatus for a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, a plurality of wafers W per cassette as a unit from/to the outside into/from the coating and developing treatment system 1; a processing station 3 including a plurality of various kinds of processing and treatment units for performing predetermined processing or treatment in a manner of single wafer processing in the photolithography processing; and an interface station 4 for delivering the wafers W to/from a not-shown aligner adjacent to the processing station 3, are integrally connected together.

In the cassette station 2, a cassette mounting table 10 is provided on which a plurality of cassettes C can be mounted in a line in an X-direction (a top-to-bottom direction in FIG. 1). In the cassette station 2, a wafer transfer unit 12 is provided which is movable in the X-direction on a transfer path 11. The wafer transfer unit 12 is also movable in an arrangement direction of the wafers W housed in the cassette C (a Z-direction; the vertical direction), and thus can selectively access the plurality of wafers W in the cassette C. The wafer transfer unit 12 is also rotatable around an axis in the vertical direction (a θ-direction), and can access the processing and treatment units included in a later-described third processing unit group G3 in the processing station 3 and transfer the wafer W to them.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side toward the interface station 4 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side toward the interface station 4 side. Between the third processing unit group G3 and the fourth processing unit group G4, a first transfer unit 20 is provided. The first transfer unit 20 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 21 is provided. The second transfer unit 21 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 30 to 34 each for applying a resist solution onto the wafer W are five-tiered in order from the bottom. In the second processing unit group G2, solution treatment units, for example, developing treatment units 40 to 44 each for supplying a developing solution to the wafer W to develop it are five-tiered in order from the bottom. Further, chemical chambers 50 and 51 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a thermal processing unit 60 for heating and cooling the wafer W, a transition unit 61 for passing the wafer W, and thermal processing units 62 to 68 each for heating and cooling the wafer W, are nine-tiered in order from the bottom.

In the fourth processing unit group G4, for example, a plurality of thermal processing units each for thermally processing the wafer W, for example, pre-baking units 70 to 74 each for heat-processing the wafer W after resist coating treatment, and post-baking units 75 to 79 each for heat-processing the wafer W after developing treatment, are ten-tiered in order from the bottom. Note that each of the pre-baking units 70 to 74 and the post-baking units 75 to 79 has a heating plate and a cooling plate for mounting the wafer W thereon and capable of both heating and cooling it.

In the fifth processing unit group G5, a plurality of thermal processing units each for thermally processing the wafer W, for example, post-exposure baking units 80 to 89 each for heat-processing the wafer W after exposure are ten-tiered in order from the bottom. The configuration of the post-exposure baking units 80 to 89 will be described later.

As shown in FIG. 1, on the positive direction side in the X-direction of the first transfer unit 20, a plurality of treatment units are arranged, for example, adhesion units 90 and 91 each for performing hydrophobic treatment on the wafer W being two-tiered in order from the bottom as shown in FIG. 3. As shown in FIG. 1, on the positive side in the X-direction of the second transfer unit 21, for example, an edge exposure processing unit 92 is disposed which selectively exposes only the edge portion of the wafer W to light.

In the interface station 4, for example, a wafer transfer unit 101 moving on a transfer path 100 extending in the X-direction and a buffer cassette 102 are provided as shown in FIG. 1. The wafer transfer unit 101 is movable in the Z-direction and also rotatable in the θ-direction, and thus can access the aligner adjacent to the interface station 4, the buffer cassette 102, and the processing and treatment units in the fifth processing unit group G5 and transfer the wafer W to them.

Figure 4:
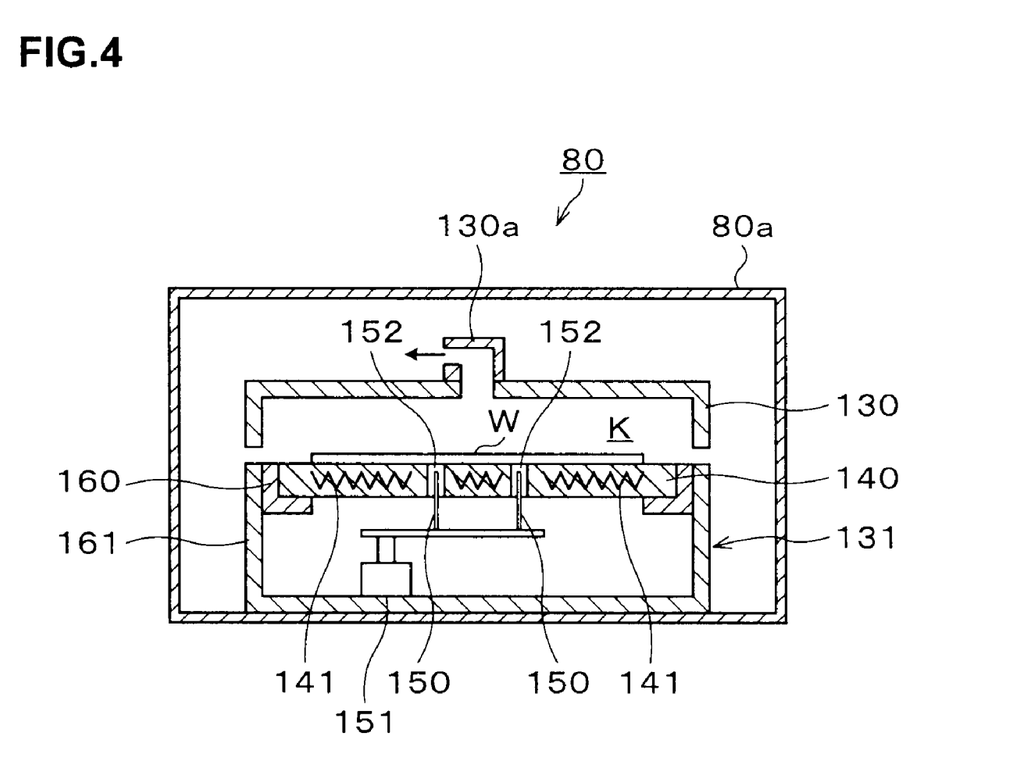
FIG. 4 is an explanatory view of a longitudinal section showing the outline of a configuration of a post-exposure baking unit.

Next, the configuration of the above-described post-exposure baking units 80 to 89 will be described. For example, the post-exposure baking unit 80 has, in a casing 80a as shown in FIG. 4, a lid body 130 that is located on the upper side and vertically movable, and a thermal plate accommodating unit 131 that is located on the lower side and forms a processing chamber K together with the lid body 130.

The lid body 130 has an almost cylindrical shape with a lower face open. The central portion of the upper surface of the lid body 130 is provided with an exhaust portion 130a. The atmosphere in the processing chamber K is uniformly exhausted through the exhaust portion 130a.

Figure 5:
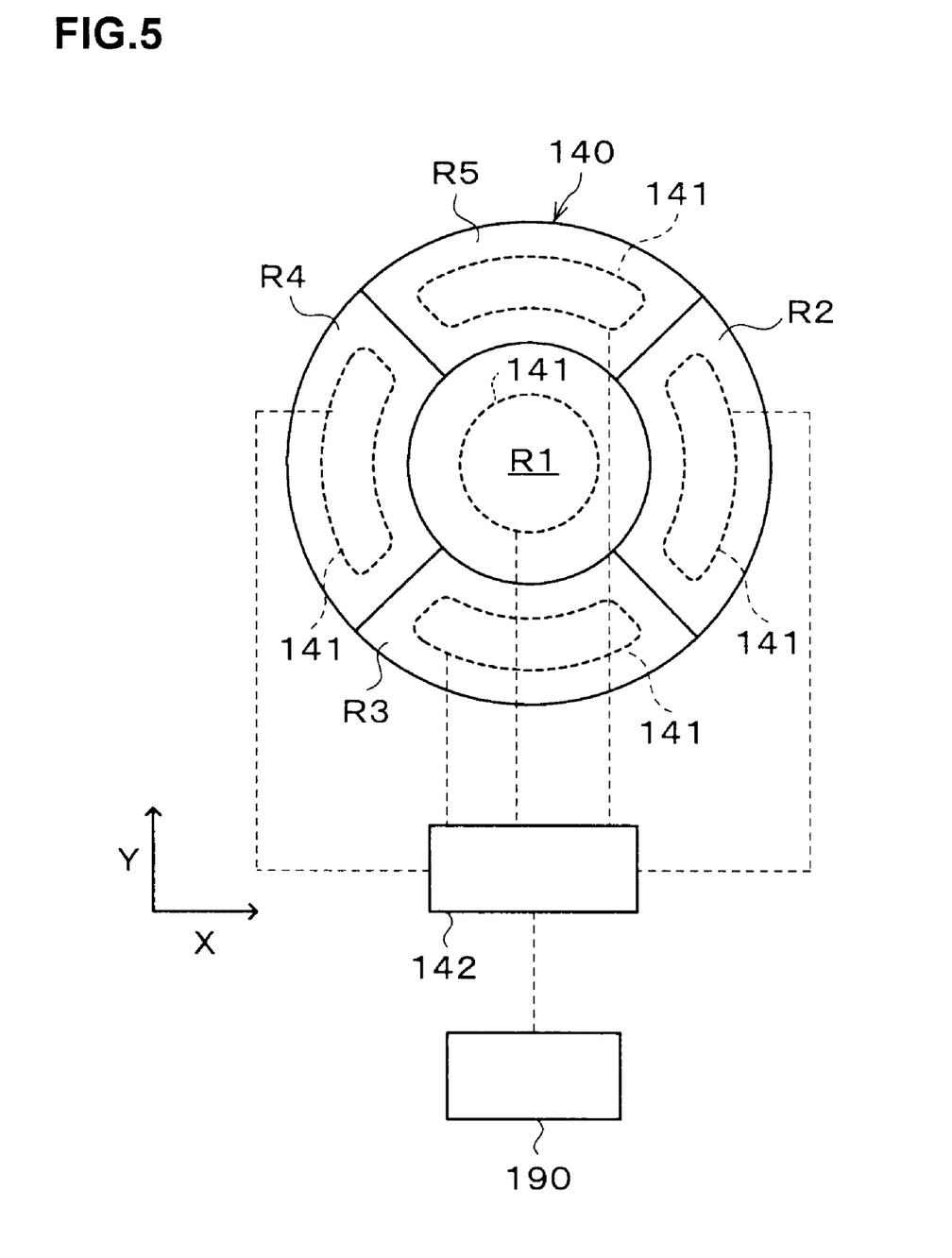
FIG. 5 is a plan view of a configuration of a thermal plate of the post-exposure baking unit.

At the central portion of the thermal plate accommodating unit 131, a thermal plate 140 is provided as a thermal processing plate. The thermal plate 140 is formed in a substantial disk shape. The thermal plate 140 is divided into a plurality of, for example, five thermal plate regions $R_1$, $R_2$, $R_3$, $R_4$ and $R_5$ as shown in FIG. 5. The thermal plate 140 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 141 generating heat by power feeding is individually embedded in each of the thermal plate regions $R_1$ to $R_5$ of the thermal plate 140 and can heat each of the thermal plate regions $R_1$ to $R_5$. The heating value of each of the heaters 141 of the thermal plate regions $R_1$ to $R_5$ is adjusted, for example, by a temperature controller 142. The temperature controller 142 can adjust the heating value of each of the heaters 141 to control the temperature of each of the thermal plate regions $R_1$ to $R_5$ to a predetermined set temperature. The temperature setting in the temperature controller 142 is performed, for example, by a later-described temperature setting unit 190.

As shown in FIG. 4, raising and lowering pins 150 for supporting the lower side of the wafer W and raising and lowering the wafer W are provided below the thermal plate 140. The raising and lowering pins 150 are configured to be vertically movable by means of a raising and lowering drive mechanism 151. Near the central portion of the thermal plate 140, through holes 152 are formed which pass through the thermal plate 140 in its thickness direction. The raising and lowering pins 150 can rise from below the thermal plate 140 and pass through the through holes 152 to project to above the thermal plate 140.

The thermal plate accommodating unit 131 includes an annular supporting member 160 for accommodating the thermal plate 140 and supporting the outer peripheral portion of the thermal plate 140, and a support ring 161 almost in a cylindrical shape surrounding the outer periphery of the supporting member 160.

The post-exposure baking unit 80 has a not-shown cooling plate, for example, adjacent to the thermal plate 140 and can mount and cool the wafer W thereon. Accordingly, the post-exposure baking unit 80 can perform both heating and cooling.

The configuration of the post-exposure baking unit 81 to 89 is the same as that of the post-exposure baking unit 80, and therefore their description will be omitted.

In the same clean room, for example, as the coating and developing treatment system 1, an etching treatment unit 170 is provided which performs etching treatment on a processing film after photolithography processing as shown in FIG. 1.

Figure 6:
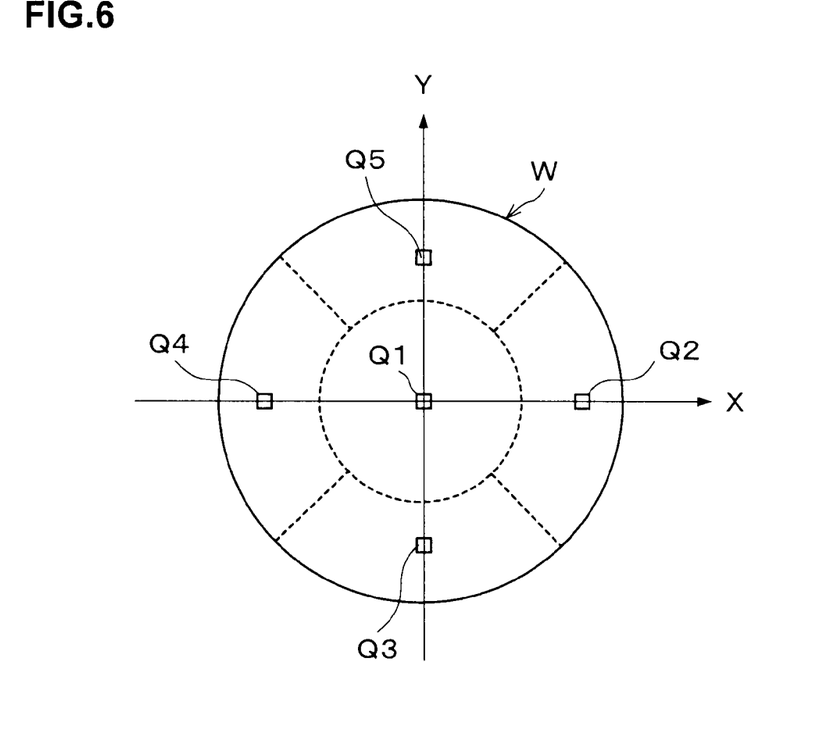
FIG. 6 is an explanatory view showing measurement points of line widths within a wafer.

In the clean room, a line width measuring unit 171 is provided which measures the line width of an etching pattern formed in the processing film on the wafer W. In the line width measuring unit 171, the line widths at a plurality of measurement points $Q_1$, $Q_2$, $Q_3$, $Q_4$, and $Q_5$ within the wafer as shown in FIG. 6 can be measured. In this embodiment, for example, the measurement points $Q_1$ to $Q_5$ are arranged within the wafer to correspond to regions $R_1$ to $R_5$ of the thermal plate 140.

In the coating and developing treatment system 1, the following photolithography processing is performed. First of all, unprocessed wafers W are taken out by the wafer transfer unit 12 shown in FIG. 1 one by one from the cassette C on the cassette mounting table 10, and transferred to the processing station 3. The wafer W is transferred to the thermal processing unit 60 included in the third processing unit group G3 in the processing station 3 and temperature-regulated to a predetermined temperature. The wafer W is then transferred by the first transfer unit 20, for example, to the adhesion unit 90 and subjected to adhesion treatment. The wafer W is then transferred by the first transfer unit 20, for example, to the resist coating unit 30, where a resist solution is applied onto the processing film on the wafer W to form a resist film.

After the resist coating treatment, the wafer W is transferred by the first transfer unit 20, for example, to the pre-baking unit 71 and subjected to pre-baking. The wafer W is subsequently transferred by the second transfer unit 21 to the edge exposure unit 92 and subjected to edge exposure. The wafer W is then transferred by the wafer transfer unit 101 in the interface station 4 to the not-shown aligner, where the wafer is exposed to light. The wafer W is transferred by the wafer transfer unit 101, for example, to the post-exposure baking unit 80 in the processing station 3.

After transferred into the post-exposure baking unit 80, the wafer W is passed to the raising and lowering pins 150 which have been raised and waiting in advance. Subsequently, the raising and lowering pins 150 are lowered so that the wafer W is mounted and heated on the thermal plate 140. In this event, each of the thermal plate regions $R_1$ to $R_5$ of the thermal plate 140 is set to a predetermined temperature, so that the wafer heated at a predetermined temperature within a plane. Thus, the wafer W is subjected to heat-processing for a predetermined time. After a lapse of a predetermined time, the wafer W is raised from the thermal plate 140 by the raising and lowering pins 150, with which the heat-processing for the wafer W ends.

After the heat-processing has been finished in the post-exposure baking unit 80, the wafer W is transferred by the second transfer unit 21 to the developing treatment unit 40, where the resist film on the wafer W is developed. After the development, the wafer W is transferred by the second transfer unit 21 to the post-baking unit 75 and subjected to post-baking processing. The wafer W is then transferred by the first transfer unit 20 to the transition unit 61 and returned to the cassette C by the wafer transfer unit 12, with which a series of photolithography processing ends.

The wafer W is then transferred to the etching treatment unit 170, where the base processing film is etched using the resist pattern as a mask. Thus, an etching pattern is formed in the processing film on the wafer W.

Here, a configuration of the temperature setting apparatus 190 which sets the temperature of the thermal plate 140 of the post-exposure baking unit 80 will be described. For example, the temperature setting apparatus 190 is composed of a general-purpose computer including, for example, a CPU and a memory, and is provided in the cassette station 2 of the coating and developing treatment system 1 as shown in FIG. 1.

Figure 7:
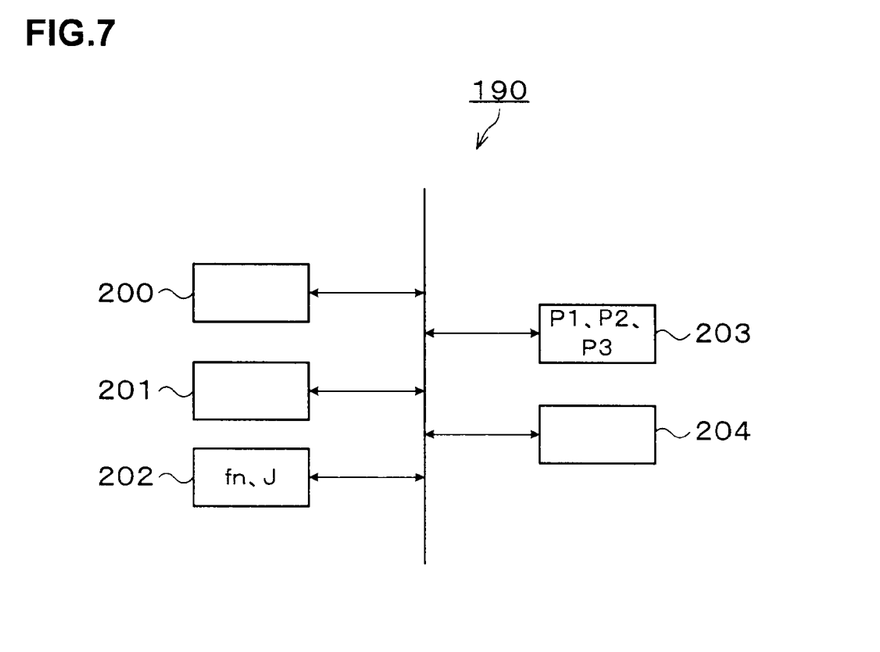
FIG. 7 is a block diagram showing a configuration of a temperature setting apparatus.

The temperature setting apparatus 190 comprises, for example, as shown in FIG. 7, a calculation unit 200 for executing various kinds of programs; an input unit 201 for inputting, for example, various kinds of information for temperature setting; a data storage unit 202 for storing various kinds of information such as a relational expression fn as a first function and a relational model J as a second function for calculating a temperature correction value; a program storage unit 203 for storing various kinds of programs for temperature setting; and a communication unit 204 for communicating with the temperature controller 142 to change the temperature setting of the thermal plate 140.

Figure 8:
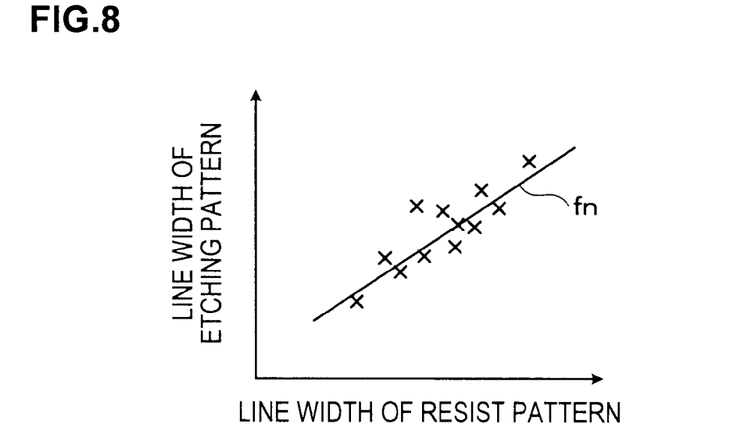
FIG. 8 is a graph showing a relational expression of the line width of an etching pattern and the line width of a resist pattern.

For example, the data storage unit 202 stores a plurality of relational expressions fn (n=1, 2, 3, 4, 5) showing the correlation between the line widths of the etching pattern and the line widths of the resist pattern. The relational expression fn is obtained for each of the measurement points $Q_1$ to $Q_5$ within the wafer, for example, by the line width measuring unit 171 and expressed by a linear function as shown in FIG. 8.

Figure 9:
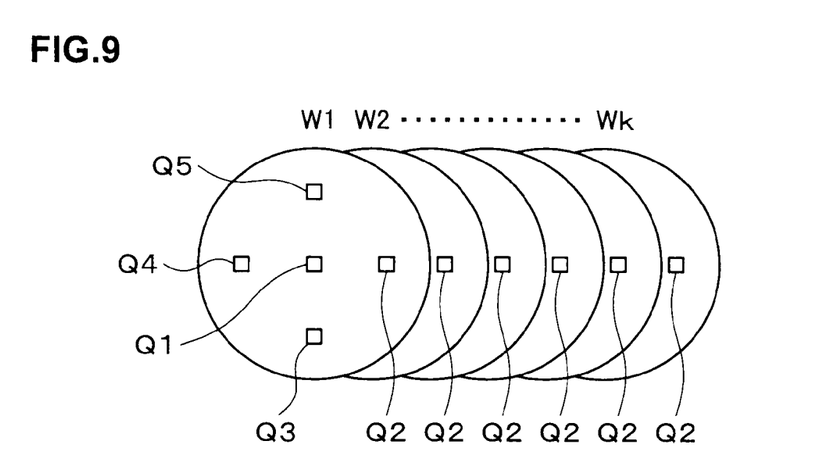
FIG. 9 is an explanatory view showing a plurality of wafers whose line widths are measured to create relational expressions.

The relational expression fn is created, for example, as follows. For example, as shown in FIG. 9, the photolithography processing and the etching treatment are performed with the temperature correction values (the temperature offset values) of the thermal plate 140 being slightly changed for each of a plurality of wafers $W_1$ to $W_k$ as shown in FIG. 9, and the line width of the etching pattern and the line width of the resist pattern are measured at each of the measurement points $Q_1$ to $Q_5$. Subsequently, for each of the measurement points $Q_1$ to $Q_5$, the relation between the line widths of the etching patterns and the line widths of the resist patterns of the wafers $W_1$ to $W_k$ are plotted on a graph to create a scatter diagram as shown in FIG. 8. From the scatter diagram, an approximate straight line of a linear function, for example, using the least square method, and this approximate straight line is regarded as the relational expression fn. Thus, a relational expression f1 is created for the measurement point $Q_1$, a relational expression f2 is created for the measurement point $Q_2$, a relational expression f3 is created for the measurement point $Q_3$, a relational expression f4 is created for the measurement point $Q_4$, and a relational expression f5 is created for the measurement point $Q_5$.

For example, the data storage unit 202 stores the relational model J between the correction amount for the resist pattern of the resist pattern and the temperature correction value for the thermal plate 140. The relational model J indicates the correlation between target correction amounts ΔCD for the line widths within the wafer of the resist pattern and temperature correction values ΔT for the thermal plate regions $R_1$ to $R_5$ and satisfies the following relational expression (1).

$$\Delta CD = J \cdot \Delta T \quad (1)$$

Figure 10:
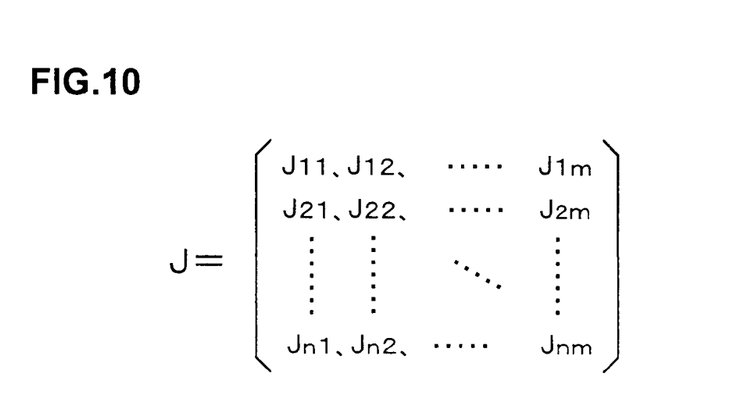
FIG. 10 is an explanatory view showing a general formula of a relational model.

Specifically, the relational model J is a matrix of n rows by m columns as shown in FIG. 10 which is expressed using a predetermined coefficient indicating in-plane variations in line width, for example, varying per 1° C.

Figure 11:
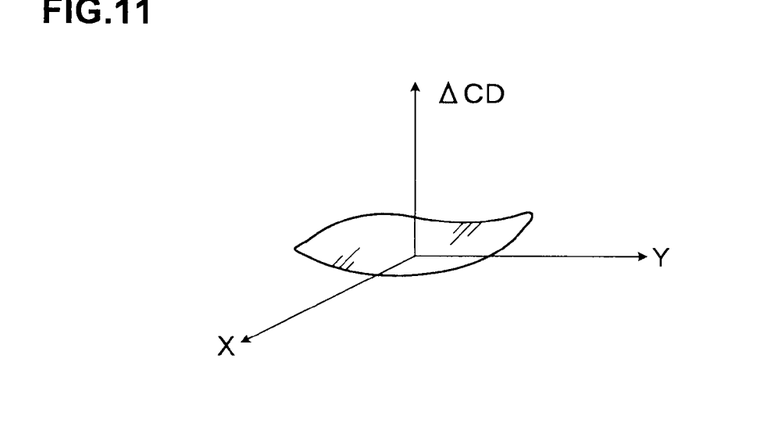
FIG. 11 is a schematic diagram showing variations in line width within the wafer in a contour form.

The relational model J is created, for example, as follows. The photolithography processing is performed for the wafer W, for example, with the temperature setting of one of the thermal plate regions of the thermal plate 140 being raised by 1° C. from the current setting, and the line widths of the resultantly formed resist pattern within the wafer is measured. This line width measurement is performed for each of the thermal plate regions $R_1$ to $R_5$, so that line width measurement is performed five times in total. The line width measurements leads to detection of the line width change amounts of the resist pattern within the wafer when the temperature setting of each of the thermal plate regions is raised by 1° C. The line width change amounts within the wafer are grasped as a curved surface in a contour form within a plane of x, y two dimensions, for example, as shown in FIG. 11, and this curved surface is expressed by a polynomial function and coefficients jk of the polynomial function are elements of the relational model J.

The program storage unit 203 stores a conversion program P1 to convert the measured line widths within the wafer of the etching pattern into the line widths within the wafer of the resist pattern using the relational expressions fn; a calculation program P2 to calculate the temperature correction values ΔT for the thermal plate regions $R_1$ to $R_5$ of the thermal plate 140 from the conversion result of the line widths within the wafer of the resist pattern using the relational model J; a setting change program P3 to change the existing temperature settings of the temperature controller 142 based on the calculated temperature correction values ΔT, and so on. The various programs to realize the temperature setting process may be ones recorded on a recording medium such as a computer-readable CD and installed from the recording medium into the temperature setting apparatus 190.

For example, the conversion program P1 converts the measures line width values at the measurement points $Q_1$ to $Q_5$ 5 within the wafer into the line widths of the resist pattern using the relational expressions fn.

For example, the calculation program P2 obtains necessary correction amounts ΔCD, for example, from the line width conversion result of the resist pattern obtained by the conversion program P1. For example, the converted line widths within the wafer are expressed by the polynomial function, and the coefficients jk of the polynomial function are obtained, and values made by multiplying the coefficients jk by −1 so that the coefficients jk becomes zero are regarded as the line width correction amounts ΔCD. Then, the calculation program P2 can calculate the temperature correction values ΔT for the thermal plate regions $R_1$ to $R_5$ using the relational model J from the correction amounts ΔCD. In this event, the temperature correction values ΔT can be calculated from the correction amounts ΔCD by the following expression (2) which is made by deforming the relational expression (1).

$$\Delta T = J^{-1} \cdot \Delta CD \quad (2)$$

Figure 12:
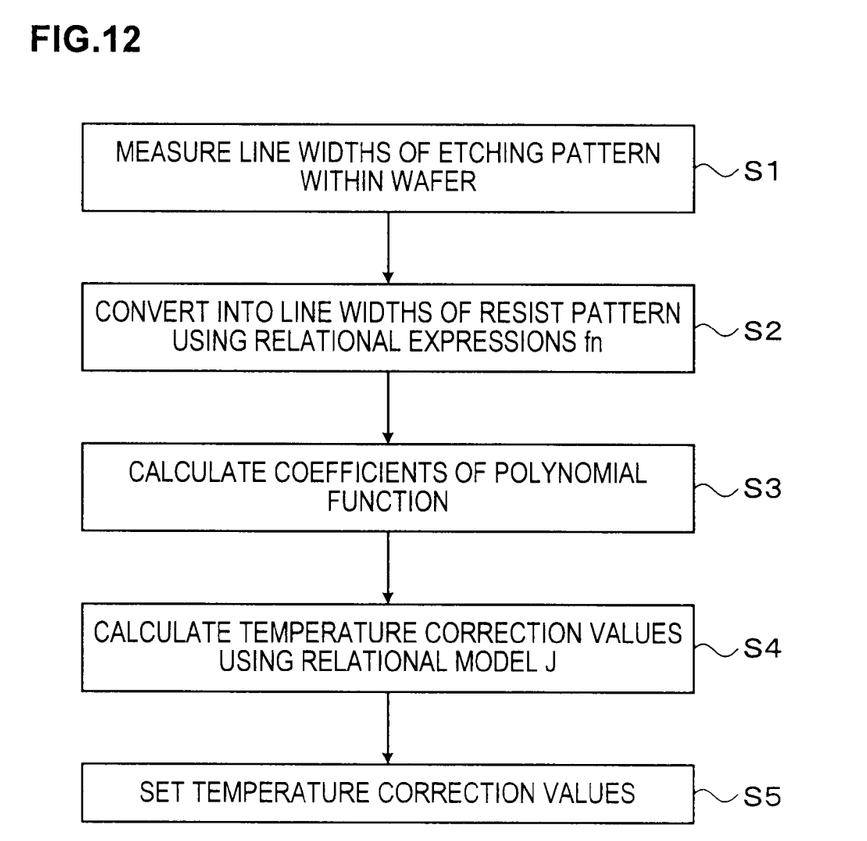
FIG. 12 is a flowchart showing a temperature setting process.

Next, the temperature setting process by the temperature setting apparatus 190 configured as described above will be described. FIG. 12 is a flowchart showing main steps of the temperature setting process.

First of all, the wafer W for which a series of photolithography processing has been performed in the coating and developing treatment system 1 and then etching treatment has been performed in the etching treatment unit 170 is transferred into the line width measuring unit 171. In the line width measuring unit 171, the line widths of the etching pattern formed in the processing film on the wafer W are measured (Step S1 in FIG. 12). In this event, the line widths at a plurality of measurement points $Q_1$ to $Q_5$ within the wafer as shown in FIG. 6 are measured to obtain the line widths over the entire wafer W corresponding to the respective thermal plate regions $R_1$ to $R_5$ of the thermal plate 140.

Subsequently, the line width measurement results at the measurement points $Q_1$ to $Q_5$ of the etching pattern are outputted to the temperature setting apparatus 190. In the temperature setting apparatus 190, the measured line widths within the wafer of the etching pattern are converted into the line widths within the wafer of the resist pattern using the relation expressions fn (Step S2 in FIG. 12). In this event, the line width measured values at the measurement points $Q_1$ to $Q_5$ are converted to the line widths of the resist pattern using the corresponding relational expressions $f_1$ to $f_5$ respectively.

Next, in the temperature setting apparatus 190, the coefficients jk when expressing the variations in line width within the wafer by the polynomial function are calculated from the line width conversion results within the wafer of the resist pattern (Step S3 in FIG. 12). The coefficients jk are calculated from the line widths of the resist pattern converted from the line width measurement results of the etching pattern, and thus indirectly indicates the in-plane variations in measured line widths of the etching pattern, so that by bringing the coefficients jk to zero, the in-plane variations in line widths of the etching pattern can be eliminated.

Therefore, the line width correction amounts ΔCD made by multiplying the coefficients jk by −1 are calculated as the target correction amounts. Then, these line width correction amounts ΔCD are substituted into the relational expression (2) so that the temperature correction values ΔT ($\Delta T_1$ to $\Delta T_5$) for the thermal plate regions $R_1$ to $R_5$ are calculated using the relational model J (Step S4 in FIG. 12). This calculation calculates the temperature correction values $\Delta T_1$ to $\Delta T_5$, for example, to bring the coefficients jk to zero to eliminate the in-plane variations in line width of the etching pattern.

Thereafter, information on the temperature correction values $\Delta T_1$ to $\Delta T_5$ is outputted from the communication unit 204 to the temperature controller 142, and the temperature correction values for the thermal plate regions $R_1$ to $R_5$ of the thermal plate 140 in the temperature controller 142 are changed, whereby new set temperatures are set (Step S5 in FIG. 12).

Note that the temperature setting process is realized, for example, by executing the various programs stored in the program storage unit 203 of the temperature setting apparatus 190.

According to the above embodiment, for the wafer W for which a series of photolithography processing and etching treatment have been finished, the line widths of the etching pattern within the wafer are measured, and the measured line widths within the wafer of the etching pattern are converted into the line widths within the wafer of the resist pattern using the relational expressions fn which have been obtained in advance.

Then, the temperature correction values ΔT for the thermal plate regions $R_1$ to $R_5$ in the post-exposure baking unit 80 are calculated from the result of conversion of the line widths within the wafer of the resist pattern using the relational model J. Then, the temperature settings for the regions $R_1$ to $R_5$ of the thermal plate 140 are changed by the temperature correction values ΔT. In this case, the previously obtained functions between the line widths of the etching pattern and the line widths of the resist pattern, and the functions between the line width correction amount ΔCD for the resist pattern and the temperature correction values ΔT are used to perform temperature setting for the post-exposure baking based on the etching result, so that the final line widths of the etching pattern can be made uniform within the wafer.

Further, since the relational expression fn is obtained for each of a plurality of measurement points $Q_1$ to $Q_5$ within the wafer, variations in line width within the wafer can be more accurately grasped so that the variations can be reduced. Further, different temperature correction values are set for a plurality of wafers $W_1$ to $W_k$, the line widths of the etching pattern and the line widths of the resist pattern after processing and treatment are measured for each of the settings, the measurement results are shown as scatter diagrams as shown in FIG. 8, and the relational expressions fn are obtained from the scatter diagrams, so that relational expressions can be obtained which are relatively simple and highly accurate.

Since the temperature of the post-exposure baking of the photolithography processing greatly affects the final line widths of the etching pattern, the temperatures of the thermal plate 140 of the post-exposure baking unit 80 can be set by the method to strictly control the line widths of the etching pattern, thereby improving the uniformity of the line widths within the wafer.

Figure 13:
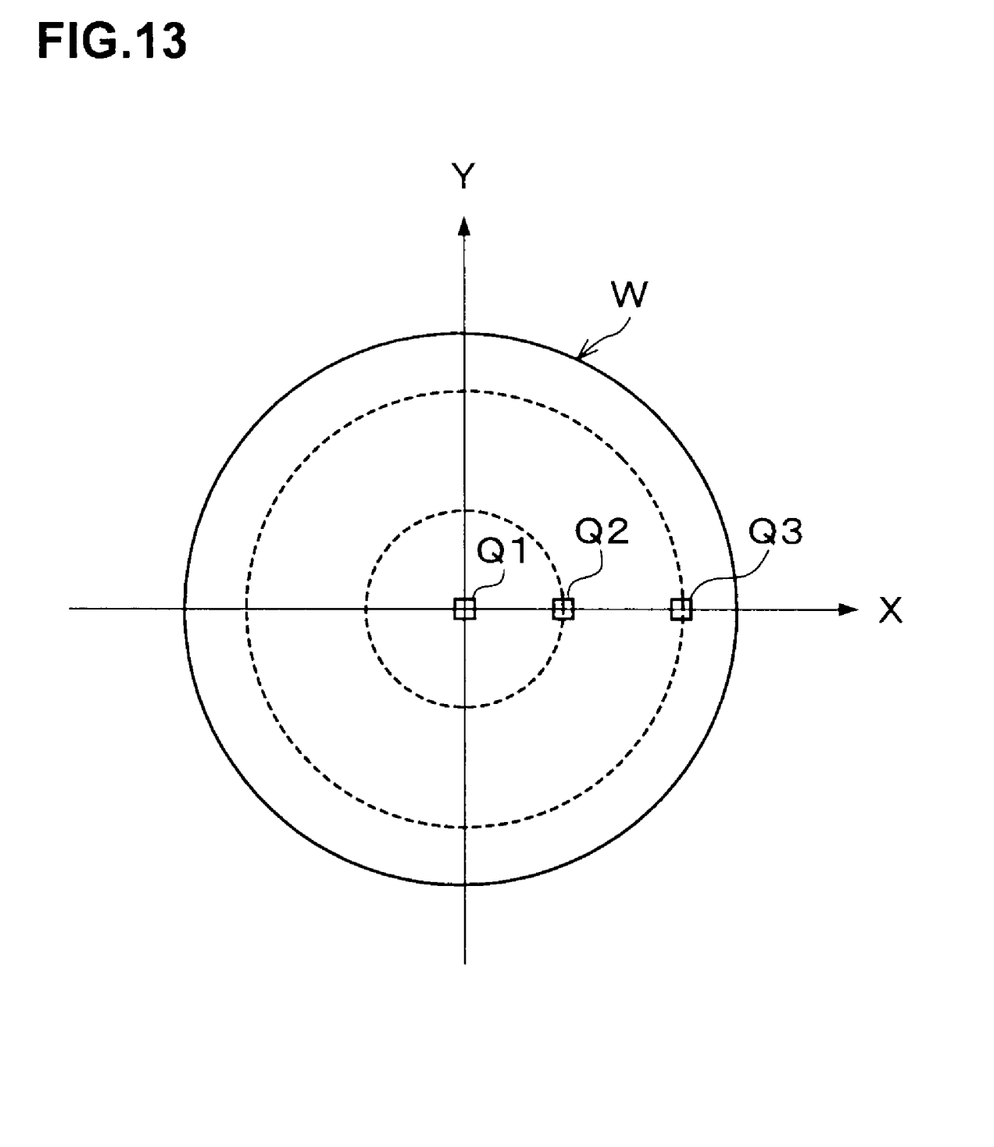
FIG. 13 is an explanatory view showing a plurality of measurement points different in distance from the center of the wafer.

Though the relational expressions fn are obtained for a plurality of points within the wafer without unevenness in the above embodiment, the relational expressions fn may be obtained for a plurality of points different in distance from the center of the wafer W. For example, as shown in FIG. 13, the relational expression fn (f1, f2, f3) may be obtained for each of a measurement point $Q_1$ at the central portion and measurement points $Q_2$ and $Q_3$ on respective circles, the line width measurement points $Q_1$, $Q_2$ and $Q_3$ being disposed on the central portion of the wafer W and on concentric circles centered at the central portion.

When the line widths of the etching pattern vary in symmetry with respect to a point, that is, when the line widths vary only toward the radial direction of the wafer W, the line widths of the etching pattern and the line widths of the resist pattern on the same circle are equal in terms of relation. In such a case, a relational expression fn is obtained for each of the measurement points different in distance from the center of the wafer W, and the line widths of the etching pattern are converted into the line widths of the resist pattern using the relational expressions fn, whereby the variations in line width within the wafer can be sufficiently grasped. Accordingly, a smaller number of relational expressions fn can be used to finally obtain the temperature correction values ΔT. Accordingly, the temperature correction values ΔT can be obtained by a simpler calculation.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

Though the relational expressions fn of a linear function are created from a plurality of measurement results of the line widths of the etching pattern and the line widths of the resist pattern as shown in FIG. 8, for example, in the above embodiment, the relational expressions fn may be created using other order functions such as quadric functions or cubic functions. In this case, from a plurality of line width measurement results of the line widths of the etching pattern and the line widths of the resist pattern (the scatter diagram) as shown in FIG. 8, an order of an approximate function may be determined using a prescribed determination coefficient to create a relational expression fn of the function of that order. In this case, more accurate relational expressions fn can be created, whereby more accurate temperature correction values $\Delta T$ can be obtained to make the line widths of the etching pattern more uniform.

Though the temperature correction values $\Delta T$ are calculated using the functions of the relational model J in the above embodiment, other functions may be used as long as they are functions between the line widths correction amounts $\Delta CD$ for the resist pattern and the temperature correction values $\Delta T$ for the thermal plate 140.

While the temperature-set thermal plate 140 is divided into five regions in the above embodiment, any number of divisions can be selected. The shapes of the divided regions of the thermal plate 140 can also be arbitrarily selected. While the relational expressions fn are created for the five points within the wafer in the above embodiment, the number of relational expressions can be arbitrarily selected.

While the above embodiment is an example in which the temperature setting of the thermal plate 140 of the post-exposure baking unit 80 is performed based on the line widths within the wafer of the etching pattern in the above embodiment, the present invention is also applicable to a case of performing the temperature setting of a thermal plate for performing other thermal processing such as pre-baking, post-baking or the like or the temperature setting of a cooling plate of a cooling processing unit for cooling the wafer W.

Besides, while the temperature setting of the thermal plate is performed to make the line widths within the wafer of the etching pattern uniform in the above embodiment, the temperature setting of a thermal processing plate may be performed so that the states other than the line widths, such as the angles of the side walls in the groove of the etching pattern (the side wall angles) or the film thicknesses of the etching pattern are uniform within the wafer. In this case, as the line width measuring unit 171, an optical profilometer is used which measures the dimension of the etching pattern using the Scatterometry method.

The optical profilometer may be used to measure the side wall angles and the film thicknesses within the wafer of the etching pattern, and the temperature setting of the thermal plate of the pre-baking unit may be performed to make them uniform within the wafer. Alternatively, the temperature setting of the thermal plate of the post-exposure baking unit may be performed to make the line widths uniform from the measurement result of the etching pattern as well as the temperature setting of the thermal plate of the pre-baking unit may be performed to make the side wall angles and the film thicknesses uniform. Furthermore, the present invention is also applicable to temperature setting of the thermal processing plate which thermally processes substrates other than the wafer, such as an FPD (Flat Panel Display), a mask reticle for a photomask, and the like.

The present invention is useful in setting the temperature of a thermal processing plate for mounting and thermally processing a substrate thereon.

What is claimed is:

1. A temperature setting method for a thermal processing plate mounting and thermally processing a substrate thereon, the thermal processing plate being divided into a plurality of regions, and a temperature being capable of being set for each of the regions, and a temperature correction value for adjusting an in-plane temperature of the thermal processing plate being capable of being set for each of the regions of the thermal processing plate, said method comprising the steps of:

measuring physical attributes of an etching pattern within the substrate for a substrate for which a series of photolithography processing including the thermal processing on the thermal processing plate and an etching treatment thereafter have been finished;

calculating correction amounts of a resist pattern within the substrate from a measurement result of the physical attributes of the etching pattern within the substrate using first functions relating the physical attributes of the etching pattern within the substrate to physical attributes of the resist pattern after the photolithography processing;

calculating the temperature correction values for the regions of the thermal processing plate from a calculation result of the physical attributes of the resist pattern within the substrate using a second function relating the correction amounts for the physical attributes of the resist pattern to the temperature correction values for the thermal processing plate; and setting the temperature for each of the regions of the thermal processing plate by each of the calculated temperature correction values.

2. The temperature setting method for a thermal processing plate as set forth in claim 1,
wherein the first functions have been obtained for a plurality of points within the substrate.

3. The temperature setting method for a thermal processing plate as set forth in claim 2,
wherein the first functions have been obtained for a plurality of points different in distance from a center of the substrate.

4. The temperature setting method for a thermal processing plate as set forth in claim 2,
wherein the measurement of the physical attributes of the etching pattern is performed at a plurality of points within the substrate, and
wherein the first function has been obtained for each of the plurality of points within the substrate.

5. The temperature setting method for a thermal processing plate as set forth in claim 1,
wherein the first functions have been obtained from a plurality of measurement results by setting a plurality of different temperature correction values and measuring the physical attributes of the etching pattern and the physical attributes of the resist pattern after the processing and treatment for each of the settings.

6. The temperature setting method for a thermal processing plate as set forth in claim 1,
wherein the thermal processing is heat-processing performed after exposure processing and before developing treatment in the photolithography processing.

7. The temperature setting method for a thermal processing plate as set forth in claim 1,
wherein the physical attribute of the etching pattern is at least any one of a line width, a film thickness, and a side wall angle of the etching pattern.

8. A temperature setting apparatus for a thermal processing plate mounting and thermally processing a substrate thereon,
    said thermal processing plate being divided into a plurality of regions, and a temperature being capable of being set for each of the regions, and
    a temperature correction value for adjusting an in-plane temperature of said thermal processing plate being capable of being set by said temperature setting apparatus for each of the regions of said thermal processing plate, said temperature setting apparatus comprising:
    a data storage unit storing, from physical attributes of an etching pattern within the substrate measured for a substrate for which a series of photolithography processing including the thermal processing on said thermal processing plate and an etching treatment thereafter have been finished, first functions relating the physical attributes of the etching pattern within the substrate to physical attributes of a resist pattern after the photolithography processing and a second function relating correction amounts for the physical attributes of the resist pattern to the temperature correction values for said thermal processing plate; and
    a program storage unit storing a program to calculate correction amounts of the resist pattern within the substrate from a measurement result of the physical attributes of the etching pattern within the substrate using the first functions, and calculate the temperature correction values for the regions of said thermal processing plate from a calculation result of the physical attributes of the resist pattern within the substrate using the second function.

9. The temperature setting apparatus for a thermal processing plate as set forth in claim 8,
    wherein the first functions have been obtained for a plurality of points within the substrate.

10. The temperature setting apparatus for a thermal processing plate as set forth in claim 9,
    wherein the first functions have been obtained for a plurality of points different in distance from a center of the substrate.

11. The temperature setting apparatus for a thermal processing plate as set forth in claim 9,
    wherein the measurement of the physical attributes of the etching pattern is performed at a plurality of points within the substrate, and
    wherein the first function has been obtained for each of the plurality of points within the substrate.

12. The temperature setting apparatus for a thermal processing plate as set forth in claim 8,
    wherein the first functions have been obtained from a plurality of measurement results by setting a plurality of different temperature correction values and measuring the physical attributes of the etching pattern and the physical attributes of the resist pattern after the processing and treatment for each of the settings.

13. The temperature setting apparatus for a thermal processing plate as set forth in claim 8,
    wherein the thermal processing is heat-processing performed after exposure processing and before developing treatment in the photolithography processing.

14. The temperature setting apparatus for a thermal processing plate as set forth in claim 8,
    wherein the physical attribute of the etching pattern is at least any one of a line width, a film thickness, and a side wall angle of the etching pattern.

15. A computer-readable storage medium storing a program running on a computer of a control unit controlling a temperature setting apparatus to cause the temperature setting apparatus to execute a temperature setting method for a thermal processing plate,
    in the temperature setting apparatus, the thermal processing plate being divided into a plurality of regions, and a temperature being capable of being set for each of the regions, and
    a temperature correction value for adjusting an in-plane temperature of the thermal processing plate being capable of being set for each of the regions of the thermal processing plate,
    wherein said method comprises the steps of:
    measuring physical attributes of an etching pattern within the substrate for a substrate for which a series of photolithography processing including the thermal processing on the thermal processing plate and an etching treatment thereafter have been finished;
    calculating correction amounts of a resist pattern within the substrate from a measurement result of the physical attributes of the etching pattern within the substrate using first functions relating the physical attributes of the etching pattern within the substrate to physical attributes of the resist pattern after the photolithography processing;
    calculating the temperature correction values for the regions of the thermal processing plate from a calculation result of the physical attributes of the resist pattern within the substrate using a second function relating the correction amounts for the physical attributes of the resist pattern to the temperature correction values for the thermal processing plate; and
    setting the temperature for each of the regions of the thermal processing plate by each of the calculated temperature correction values.

16. A substrate processing system comprising:
    a coating unit;
    a developing unit;
    a baking unit having a thermal processing plate divided into a plurality of temperature controllable regions for adjusting a temperature profile on a substrate disposed on the thermal processing plate;
    a line width measurement unit which measures a resist pattern physical attribute and an etched line physical attribute in the substrate; and
    a temperature setting unit which changes a temperature of one or more of the temperature controllable regions based on the measured resist pattern physical attribute and the measured etched line physical attribute.

17. The system of claim 16, wherein the temperature setting unit:
    measures physical attributes of an etching pattern within the substrate for a substrate for which a series of photolithography processing including the thermal processing on the thermal processing plate and an etching treatment thereafter have been finished;
    calculates correction amounts of a resist pattern within the substrate from a measurement result of the physical attributes of the etching pattern within the substrate using first functions relating the physical attributes of the etching pattern within the substrate to physical attributes of the resist pattern after the photolithography processing;
    calculating the temperature correction values for the regions of the thermal processing plate from a calculation result of the physical attributes of the resist pattern within the substrate using a second function relating the correction amounts for the physical attributes of the resist pattern to the temperature correction values for the thermal processing plate; and setting the temperature for each of the regions of the thermal processing plate by each of the calculated temperature correction values.

18. The system of claim 17, wherein the temperature setting unit obtains the first functions for a plurality of points within the substrate.

19. The system of claim 17, wherein the temperature setting unit obtains the first functions for a plurality of points different in distance from a center of the substrate.

20. The system of claim 17, wherein the line width measurement unit measures the physical attributes of the etching pattern at a plurality of points within the substrate, and the temperature setting unit obtains the first functions for one or more of the plurality of points within the substrate.

21. The system of claim 17, wherein the temperature setting unit obtains first functions from a plurality of measurement results by setting a plurality of different temperature correction values, and the line width measurement unit measures the physical attributes of the etching pattern and the physical attributes of the resist pattern for each of the settings of the plurality of different temperature correction values.

22. The system of claim 17, wherein the baking unit performs heat-processing of the substrate after exposure processing and before developing treatment.

23. The system of claim 17, wherein the line width measurement unit measures at least one of a line width, a film thickness, and a side wall angle.

* * * * *